United States Patent
Yabuhara

(10) Patent No.: US 10,096,974 B2
(45) Date of Patent: Oct. 9, 2018

(54) QUANTUM CASCADE LASER

(71) Applicant: KABUSHIKI KAISHA TOSHIBA, Minato-ku (JP)

(72) Inventor: Hidehiko Yabuhara, Kamakura (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 16 days.

(21) Appl. No.: 15/125,812

(22) PCT Filed: Sep. 17, 2015

(86) PCT No.: PCT/JP2015/076577
§ 371 (c)(1),
(2) Date: Sep. 13, 2016

(87) PCT Pub. No.: WO2016/147450
PCT Pub. Date: Sep. 22, 2016

(65) Prior Publication Data
US 2018/0006434 A1    Jan. 4, 2018

(30) Foreign Application Priority Data

Mar. 13, 2015    (JP) ................................ 2015-050522

(51) Int. Cl.
*H01S 5/34* (2006.01)
*H01S 5/343* (2006.01)

(52) U.S. Cl.
CPC .......... *H01S 5/3407* (2013.01); *H01S 5/3401* (2013.01); *H01S 5/3402* (2013.01); *H01S 5/34366* (2013.01); *H01S 2301/17* (2013.01)

(58) Field of Classification Search
CPC ............... H01S 5/3407; H01S 5/34366; H01S 2301/17; H01S 5/3401; H01S 5/3402
See application file for complete search history.

(56) References Cited

U.S. PATENT DOCUMENTS

2005/0036530 A1    2/2005 Schneider et al.
2012/0039350 A1*   2/2012 Botez .................... B82Y 10/00
                                                    372/45.012
(Continued)

FOREIGN PATENT DOCUMENTS

JP    2010-278326 A    12/2010
JP    2013-534369 A     9/2013
JP    2014-534648 A    12/2014

OTHER PUBLICATIONS

Feng Xie, et al., "Room Temperature CW Operation of Short Wavelength Quantum Cascade Lasers Made of Strain Balanced GaxIn1—xAs/AlyIn1—yAs Material on InP Substrates", IEEE Journal of Selected Topics in Quantum Electronics, vol. 17, No. 5, Sep. 2011, pp. 1445-1451.*

(Continued)

*Primary Examiner* — Xinning Niu
(74) *Attorney, Agent, or Firm* — Oblon, McClelland, Maier & Neustadt, L.L.P.

(57) ABSTRACT

An active layer of a quantum cascade laser includes an active layer includes a plurality of emission regions and a plurality of injection regions. Each emission region includes an injection barrier layer, and an light-emitting quantum well layer that has at least two well layers, and that emits infrared light by undergoing an intersubband transition. Each injection region includes an extraction barrier layer, and a relaxation quantum well layer that creates an energy level for relaxing the energy of carriers from the each emission region. One of adjacent two well layers in the light-emitting quantum well layer of the each emission region on the side of the extraction barrier layer is deeper than a second well layer on the side of the injection barrier layer. The each emission region and the injection region are alternately stacked.

10 Claims, 10 Drawing Sheets

D3<D1<D2

(56) References Cited

U.S. PATENT DOCUMENTS

2013/0107903 A1 5/2013 Mawst et al.
2013/0136148 A1 5/2013 Caneau et al.
2013/0329761 A1* 12/2013 Hashimoto ........... H01S 5/3401
372/45.012

OTHER PUBLICATIONS

International Search Report dated Dec. 15, 2015 in PCT/JP2015/076577.
Feng Xie, et al., "Room Temperature CW Operation of Short Wavelength Quantum Cascade Lasers Made of Strain Balanced $Ga_xIn_{1-x}As/Al_yIn_{1-y}As$ Material on InP Substrates" IEEE Journal of Selected Topics in Quantum Electronics, vol. 17, No. 5, 2011, pp. 1445-1452.
J.D. Kirch, et al. "Tapered active-region quantum cascade lasers ($\lambda$ = 4.8 µm) for virtual suppression of carrier-leakage currents" Electronics Letters, vol. 48, No. 4, Feb. 16, 2012, 2 Pages.
L.J. Mawst, et al. "InGaAs/AlInAs strain-compensated Superlattices grown on metamorphic buffer layers for low-strain, 3.6 µm-emitting quantum-cascade-laser active regions" Journal of Crystal Growth, vol. 370, 2013, pp. 230-235.
Jérôme Faist, et al., "Short wavelength ($\lambda \sim 3.4$ µm) quantum cascade laser based on strained compensated InGaAs/AlInAs" Applied Physics Letters, vol. 72, No. 6, Feb. 9, 1998, pp. 680-682.

* cited by examiner

D3<D1<D2

CO₂ CONCENTRATION: 8%
0.5 atm
TEMPERATURE: 313 K

CO₂ CONCENTRATION: 8%
0.5 atm
TEMPERATURE: 313 K

US 10,096,974 B2

QUANTUM CASCADE LASER

TECHNICAL FIELD

This invention relates to a quantum cascade laser.

BACKGROUND ART

A laser device that emits infrared rays is in wide use such as in environmental measurement. Among such laser devices is a quantum cascade laser (QCL) composed of semiconductors, which is small and convenient, and enables high-accuracy measurements.

A quantum cascade laser has an active layer with, for example, alternately stacked GaInAs and AlInAs, and containing a quantum well layer. The structure of such a quantum cascade laser is such that the active layer is sandwiched by, for example, an InP cladding layer on the both side surfaces. In such a structure, the cascade-connected quantum well layer can emit an infrared laser light of 3 to 20 μm wavelengths as the carrier undergoes an intersubband transition.

For example, the $CO_2$ gas in the breath has an intrinsic absorption spectrum under infrared irradiation. The gas concentration can thus be found by measuring the amount of infrared absorption.

Measuring the isotope ratio of $^{13}CO_2$ and $^{12}CO_2$ also enables diagnosis of human body for the presence or absence of any abnormality. In this case, the wavelength of the laser beam emitted by the quantum cascade laser needs to be controlled within a 3.5 to 4.5 μm range.

PRIOR ART DOCUMENT

Patent Document

[Patent Document 1] JP 2010-278326 A (Kokai)

SUMMARY OF INVENTION

Problem to be Solved by Invention

An object of the invention is to provide a quantum cascade laser that can produce high output in a wavelength band of 4.5 μm or less.

Means for Solving Problem

According to the embodiment of the invention, an active layer of a quantum cascade laser includes an active layer includes a plurality of emission regions and a plurality of injection regions. Each emission region includes an injection barrier layer, and an light-emitting quantum well layer that has at least two well layers, and that emits infrared light by undergoing an intersubband transition. Each injection region includes an extraction barrier layer, and a relaxation quantum well layer that creates an energy level for relaxing the energy of carriers from the each emission region. One of adjacent two well layers in the light-emitting quantum well layer of the each emission region on the side of the extraction barrier layer is deeper than a second well layer on the side of the injection barrier layer. The emission region and the injection region are alternately stacked.

EMBODIMENTS OF INVENTION

An embodiment of the invention is described below with reference to the accompanying drawings.

Figure 1A:
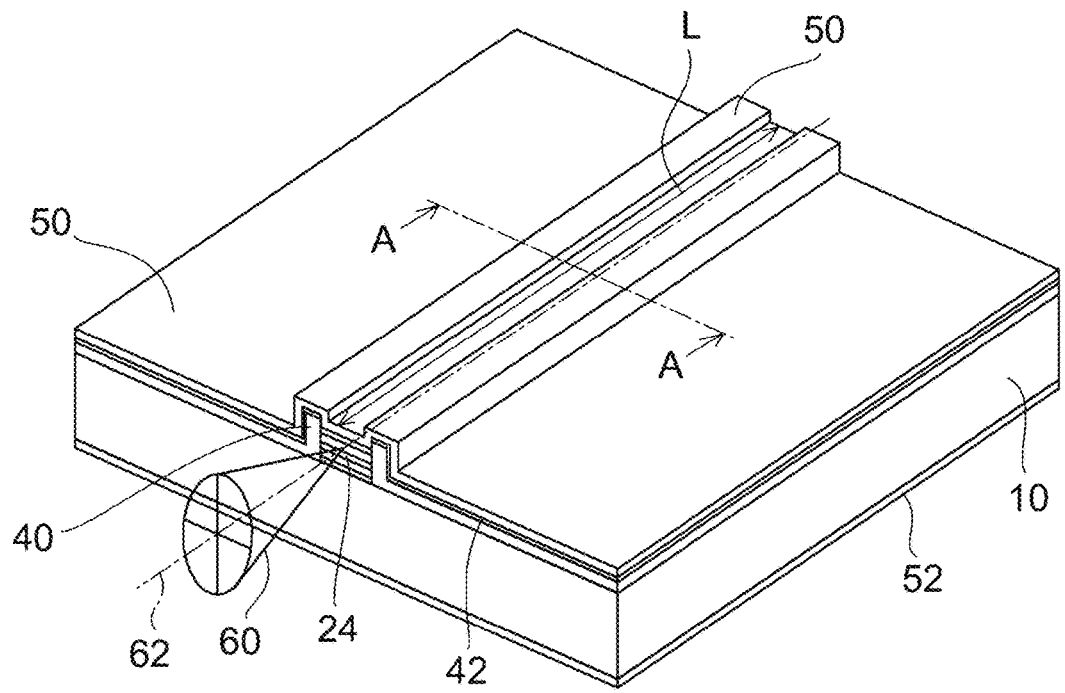
FIG. 1A is a schematic perspective view of a cutaway portion of a quantum cascade laser according to First Embodiment of the invention.
Figure 1B:
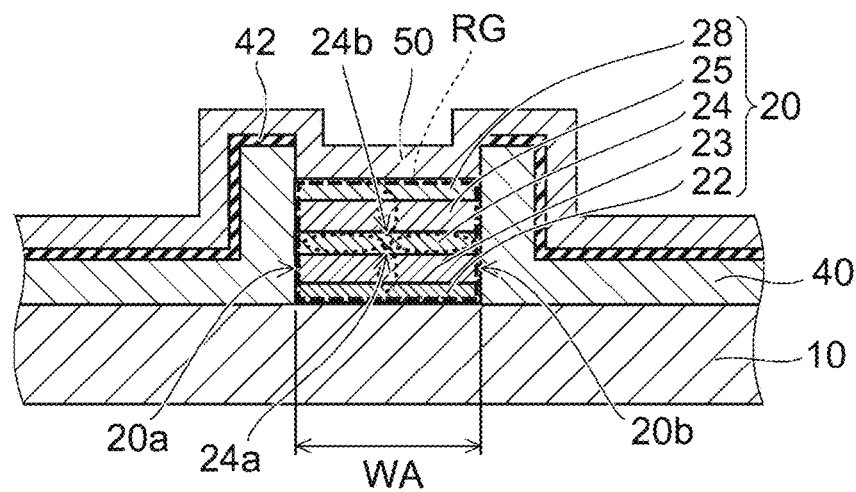
FIG. 1B is a schematic cross sectional view taken along line A-A.

FIG. 1A is a schematic perspective view of a cutaway portion of a quantum cascade laser according to First Embodiment of the invention. FIG. 1B is a schematic cross sectional view taken along line A-A.

The quantum cascade laser (QCL) includes at least a substrate 10, a stacked body 20 provided on the substrate 10, and a dielectric layer 40. The QCL may further include a first electrode 50, a second electrode 52, and an insulating film 42.

The stacked body 20 has a first cladding layer 22, a first guide layer 23, an active layer 24, a second guide layer 25, and a second cladding layer 28. The refractive indices of the first cladding layer 22 and the second cladding layer 28 are smaller than the refractive index of any of the first guide layer 23, the active layer 24, and the second guide layer 25 so that an infrared laser beam 60 can be properly trapped in the stacked direction of the active layer 24.

The stacked body 20 has a stripe shape, and can be called ridge waveguide RG. Assuming that the two end faces of the ridge waveguide RG are mirror surfaces, the light of stimulated emission is emitted as the infrared laser beam 62 through the light-emitting surface. In this case, an optical axis 62 is defined as the line that connects the centers of the cross sections of the optical resonator with the mirror surface serving as a resonating surface. In other words, the optical axis 62 lies in the direction of extension of the ridge waveguide RG.

When the width WA in a direction parallel to a first surface 24a and a second surface 24b of the active layer 24 is too wide in a cross section perpendicular to the optical axis 62, a higher-order mode occurs in the horizontal traverse direction, and it becomes difficult to achieve high output. It becomes easier to control the horizontal traverse direction mode when the width WA of the active layer 24 is, for example, 5 to 20 μm. By making the refractive index of the dielectric layer 40 smaller than the refractive index of any of the constituent layers of the active layer 24, the ridge waveguide RG can be configured along the optical axis 62 with the dielectric layer 40 provided on the both sides of side surfaces 20a and 20b of the stacked body 20.

Figure 2A:
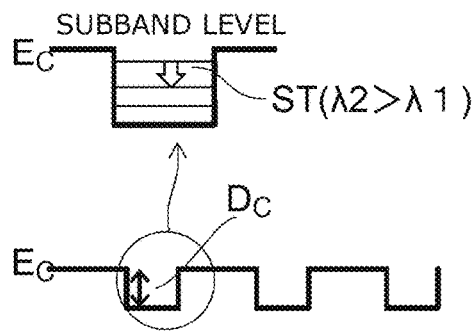
FIG. 2A is an energy band diagram of the quantum well structure of a QCL having a lattice matched light-emitting quantum well layer.
Figure 2A:
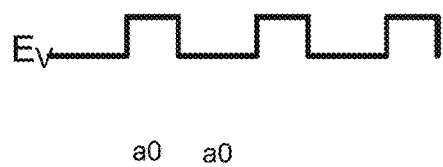
Figure 2B:
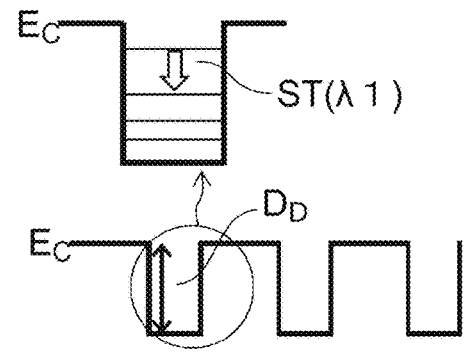
FIG. 2B is an energy band diagram of a QCL having the light-emitting quantum well layer that is not lattice matched.
Figure 2B:
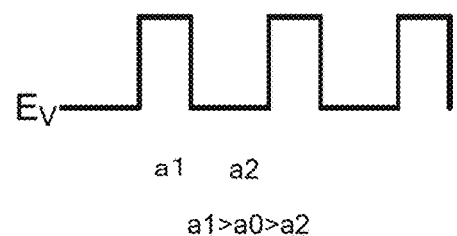

FIG. 2A is an energy band diagram of the quantum well structure of a QCL having a lattice matched light-emitting quantum well layer. FIG. 2B is an energy band diagram of a QCL having the light-emitting quantum well layer that is not lattice matched.

The QCL having the light-emitting quantum well layer shown in FIG. 2A has a MQW (Multi-Quantum Well) structure with three well layers, and the well layers have the same potential (energy) depth $D_C$. The well layers and the barrier layer constituting the light-emitting quantum well layer are lattice matched to the substrate InP (lattice constant a0: about 5.8687 angstrom). For example, the well layers may be composed of $In_{0.53}Ga_{0.47}As$, and the barrier layer may be composed of $In_{0.52}Al_{0.48}As$.

The QCL having the light-emitting quantum well layer shown in FIG. 2B has a well layer depth $D_D$ deeper than the depth $D_C$ of the well layer shown in FIG. 2A. For example, when the well layer is composed of $In_{0.669}Ga_{0.331}As$, the lattice constant a1 is about 5.9242 angstrom. When the barrier layer is composed of $In_{0.362}Al_{0.638}As$, the lattice constant a2 is about 5.8049 angstrom. This produces stress on the InP of the substrate 10, exerting compressional stress on the well layer, and tensile stress on the barrier layer. The well layer depth is equal to the energy discontinuity $\Delta E_C$ of a conduction band $E_C$.

The strain compensated MQW shown in FIG. 2B can have the well layer depth $D_D$ larger than the depth $D_C$ of the well layers shown in FIG. 2A. This makes it possible to widen the distance between the subband levels of the well layers, and the wavelength λ1 of the infrared light due to intersubband transition ST can be made shorter than the wavelength λ2 of the subband transition shown in FIG. 2A.

Figure 3:
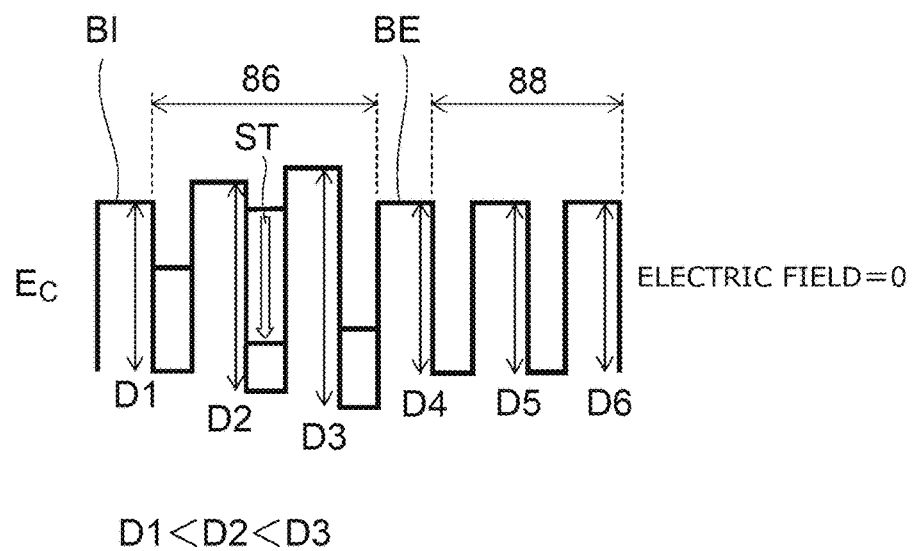
FIG. 3 is an energy band diagram of the conduction band of the QCL according to First Embodiment (zero electric field).

FIG. 3 is an energy band diagram of the conduction band of the QCL according to First Embodiment (zero electric field).

In the QCL of First Embodiment, the carriers are electrons.

The light-emitting quantum well layer 86 has a plurality of well layers. For example, the light-emitting quantum well layer 86 is shown with well layers of depths D1, D2, and D3, from the side of the injection barrier layer BI. In the adjacent two well layers of the three well layers, the well layer on the side of the extraction barrier layer BE is deeper than the well layer on the side of the injection barrier layer BI. Specifically, D1<D2, or D2<D3. The depths may be D1<D2<D3, as in the figure. In First Embodiment, the infrared light can have a shorter wavelength because of the deep well layers.

The carriers can be efficiently trapped in the deep well layers to promote intersubband transition ST. This enables high output. The subband level varies with factors such as the thickness of the well layer, and the thickness of the barrier layer. Accordingly, the emission wavelength varies with the thicknesses of the well layers and the barrier layer, for example. A relaxation quantum well layer 88 may be lattice matched to the substrate 10.

Figure 4A:
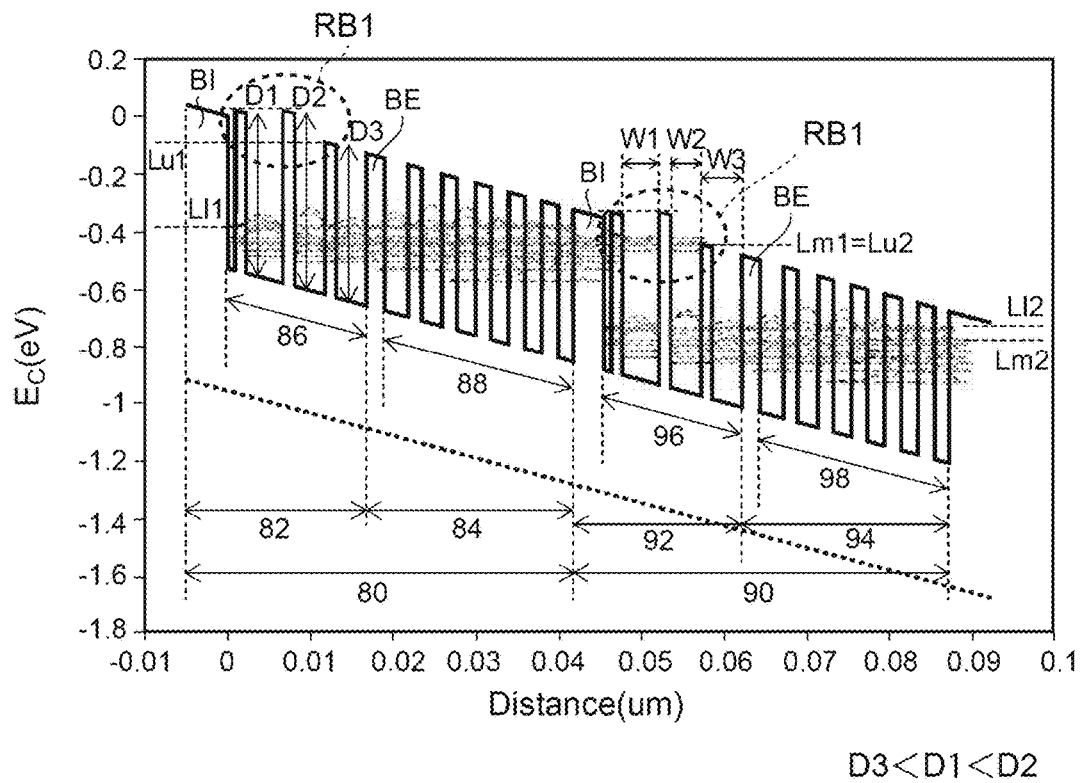
FIG. 4A is an energy band diagram of the conduction band of a QCL according to Second Embodiment (under applied electric field).
Figure 4B:
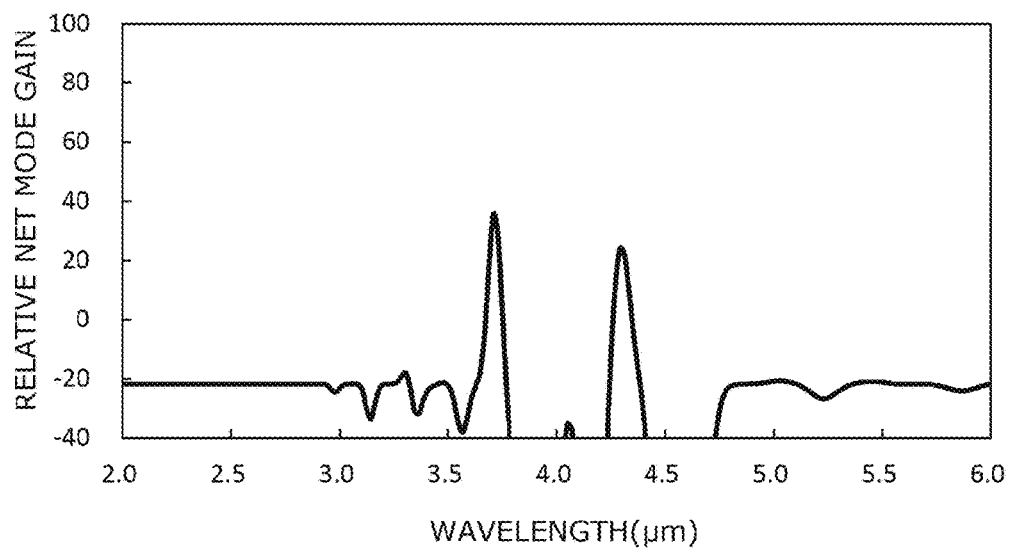
FIG. 4B is a graph representing a gain spectrum.

FIG. 4A is an energy band diagram of the conduction band of a QCL according to Second Embodiment (under applied electric field). FIG. 4B is a graph representing a gain spectrum.

The active layer 24 has a cascade structure with alternately stacked emission regions and injection regions. The wave function of electrons can be determined by simulation.

Emission regions 82 and 92 have an injection barrier layer BI, and the light-emitting quantum well layers 86 and 96 that have at least two well layers, and that emit infrared light by undergoing intersubband transitions. Injection regions 84 and 94 have an extraction barrier layer BE, and relaxation quantum well layers 88 and 98 that relax the energy of carriers from the emission regions 82 and 92, and create an energy level (for example, miniband level Lm1, Lm2) for injecting carriers to the next emission region. In the light-emitting quantum well layers 86 and 96, the well layer on the side of the extraction barrier layer BE is deeper than the well layer on the side of the injection barrier layer BI in the adjacent well layers of at least two well layers. In the figure, the well layer depth is D3<D1<D2. However, the well layer depth may progressively become deeper (D1<D2<D3).

Reducing the thickness of the well layers constituting the light-emitting quantum well layers 86 and 96 causes the energy level to become discrete, and creates subbands (for example, high level Lu, low level Ll). The injected carriers from the injection barrier layer BI become effectively trapped in the well layer, and a transition occurs from the high level Lu to the low level Ll, causing emission of light (hν) corresponding to (Lu-Ll). Energies Ll1 and Ll2 of the injected carriers in the injection region are relaxed to miniband level Lm2 through the relaxation quantum well layers 88 and 98.

Table 1 shows the configuration of the unit stacked body of a QCL according to Third Embodiment. The numbers in the last column represent the thickness of each layer (angstrom).

TABLE 1

| | | Thickness (A) |
|---|---|---|
| BI | In0.52Al0.48As | 3.7 |
| 86 | In0.53Ga0.47As | 0.9 |
| (96) | In0.50Al0.50As | 1.3 |
| | In0.53Ga0.47As | 4.5 |
| | In0.48Al0.52As | 1.3 |
| | In0.53Ga0.47As | 3.7 |
| | In0.52Al0.48As | 1.4 |
| | In0.53Ga0.47As | 3.6 |
| BE | In0.52Al0.48As | 2.2 |
| 88 | In0.53Ga0.47As | 2.8 |
| (98) | In0.52Al0.48As | 1.7 |
| | In0.53Ga0.47As | 2.5 |
| | In0.52Al0.48As | 1.8 |
| | In0.53Ga0.47As | 2.2 |
| | In0.52Al0.48As | 1.9 |
| | In0.53Ga0.47As | 2.1 |
| | In0.52Al0.48As | 2.0 |
| | In0.53Ga0.47As | 2.0 |

TABLE 1-continued

| | Thickness (A) | |
|---|---|---|
| In0.52Al0.48As | 2.0 | |
| In0.53Ga0.47As | 1.8 | |

The well layers constituting the light-emitting quantum well layers 86 and 96 are all $In_{0.53}Ga_{0.47}As$, and are lattice matched to the InP (lattice constant: a0) of the substrate 10. On the other hand, the adjacent two barrier layers composed of $In_{0.5}Al_{0.5}As$ and $In_{0.48}Al_{0.52}As$, respectively, in the constituent barrier layers of the light-emitting quantum well layers 86 and 96 have a lattice constant a2 smaller than the lattice constant a0 of the InP of the substrate 10. This raises the conduction band edges of the barrier layers constituting the light-emitting quantum well layers 86 and 96, and makes the barrier layers taller (the well layers becomes deeper), as indicated by broken line region RB1 in the energy band diagram. The carriers are thus effectively trapped in the well layers in the emission regions 82 and 92, and the light output can improve.

The injection barrier layer BI, the extraction barrier layer BE, and the relaxation quantum well layers 88 and 98 may be lattice matched to the InP of the substrate 10. In this way, desirable crystallinity can be maintained as a whole. Note that the conduction band $E_C$ has a slope in the energy band diagram under applied electric field. For example, by varying the composition ratio of the two barrier layers of the light-emitting quantum well layers 86 and 96 to create a lattice mismatch, the energy $E_C$ at the conduction band edges of the barrier layers in the broken line region RB1 can locally have substantially the same height in the sloped energy band diagram.

In the diagram, an intersubband transition occurs mainly in the second well layer (depth D1) of the light-emitting quantum well layers 86 and 96.

In FIG. 4B, the vertical axis represents relative net mode gain, and the horizontal axis represents wavelength (μm). The net mode gain G is represented by the following formula.

$$G = \Gamma \times g - \alpha,$$

where G is the net mode gain, $\Gamma$ is a light confinement coefficient, g is the medium gain, and $\alpha$ is the internal loss.

The maximum net mode gain occurs in the vicinity of 3.7 μm and 4.3 μm wavelengths. This enables $^{13}CO_2$ and $^{12}CO_2$ spectral measurements.

Figure 5A:
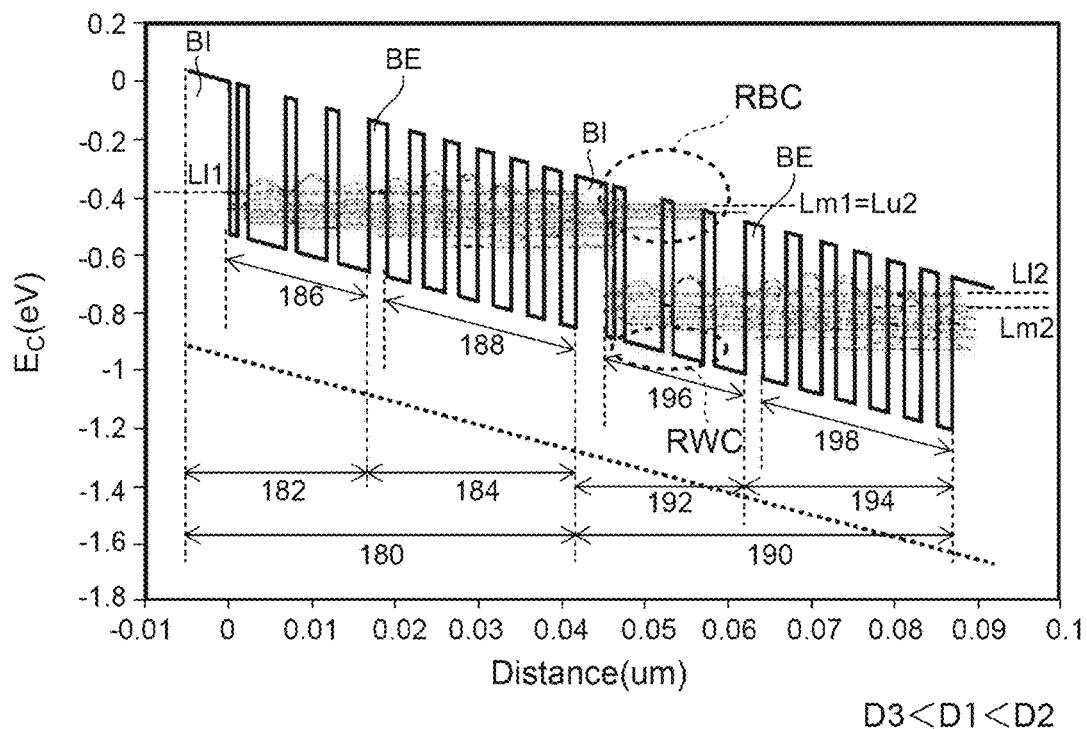
FIG. 5A is an energy band diagram of the conduction band of a QCL according to Comparative Example (under applied electric field).
Figure 5B:
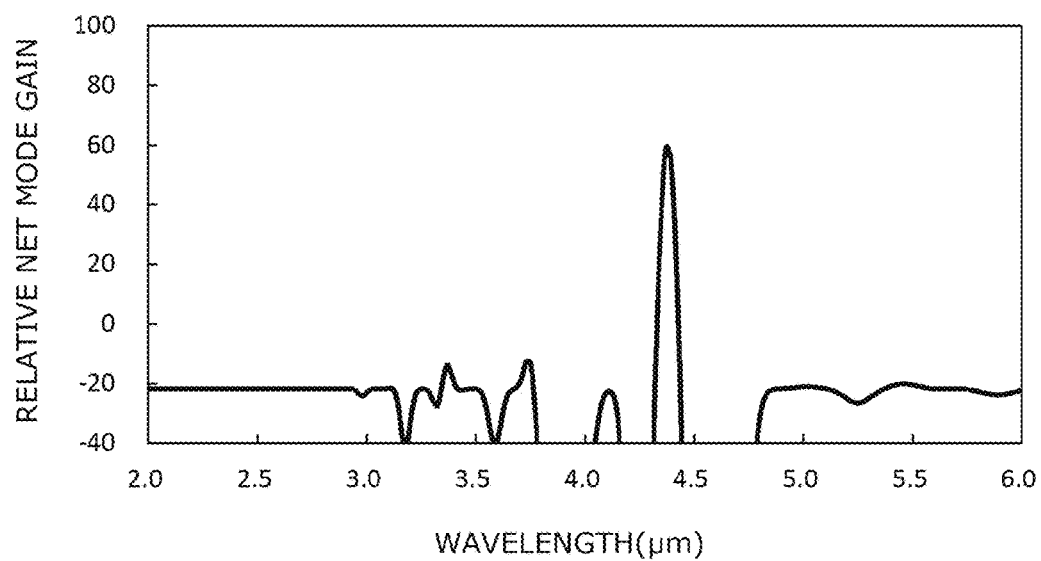
FIG. 5B is a graph representing the wavelength dependence of gain.

FIG. 5A is an energy band diagram of the conduction band of a QCL according to Comparative Example (under applied electric field). FIG. 5B is a graph representing the wavelength dependence of gain.

In Comparative Example, the quantum wells of emission regions 182 and 192 and injection regions 184 and 194 are all lattice matched to the InP of the substrate 10, as shown in Table 2. Accordingly, the barrier layers have a constant height, and larger numbers of carriers leak into the extraction barrier layer BE past the barrier layers of the light-emitting quantum well layers 186 and 196, as indicated by the broken line region RBC. This weakens the light confinement effect, and makes it difficult to improve intersubband transitions. The light output is poor accordingly.

TABLE 2

| | | Thickness (A) | |
|---|---|---|---|
| BI | | In0.52Al0.48As | 3.7 |
| 186 | | In0.53Ga0.47As | 0.9 |
| (196) | | In0.52Al0.48As | 1.3 |
| | | In0.53Ga0.47As | 4.5 |
| | | In0.52Al0.48As | 1.3 |
| | | In0.53Ga0.47As | 3.7 |
| | | In0.52Al0.48As | 1.4 |
| | | In0.53Ga0.47As | 3.6 |
| BE | | In0.52Al0.48As | 2.2 |
| 88 | | In0.53Ga0.47As | 2.8 |
| (198) | | In0.52Al0.48As | 1.7 |
| | | In0.53Ga0.47As | 2.5 |
| | | In0.52Al0.48As | 1.8 |
| | | In0.53Ga0.47As | 2.2 |
| | | In0.52Al0.48As | 1.9 |
| | | In0.53Ga0.47As | 2.1 |
| | | In0.52Al0.48As | 2.0 |
| | | In0.53Ga0.47As | 2.0 |
| | | In0.52Al0.48As | 2.0 |
| | | In0.53Ga0.47As | 1.8 |

As shown in FIG. 5B, the light-emitting quantum well layers 186 and 196 are lattice matched to the InP of the substrate 10, and the maximum gain occurs at a wavelength of 4.4 μm or more. It is difficult to make wavelength any shorter.

Figure 6A:
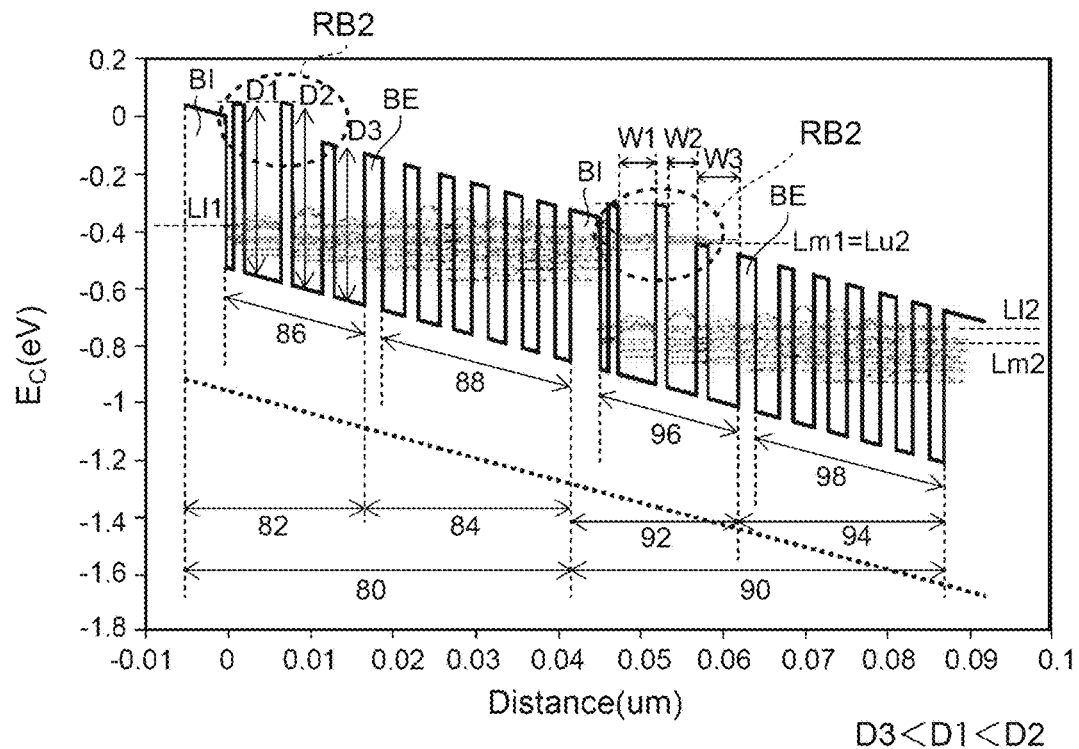
FIG. 6A is an energy band diagram of the conduction band of a QCL according to Third Embodiment (under applied electric field).
Figure 6B:
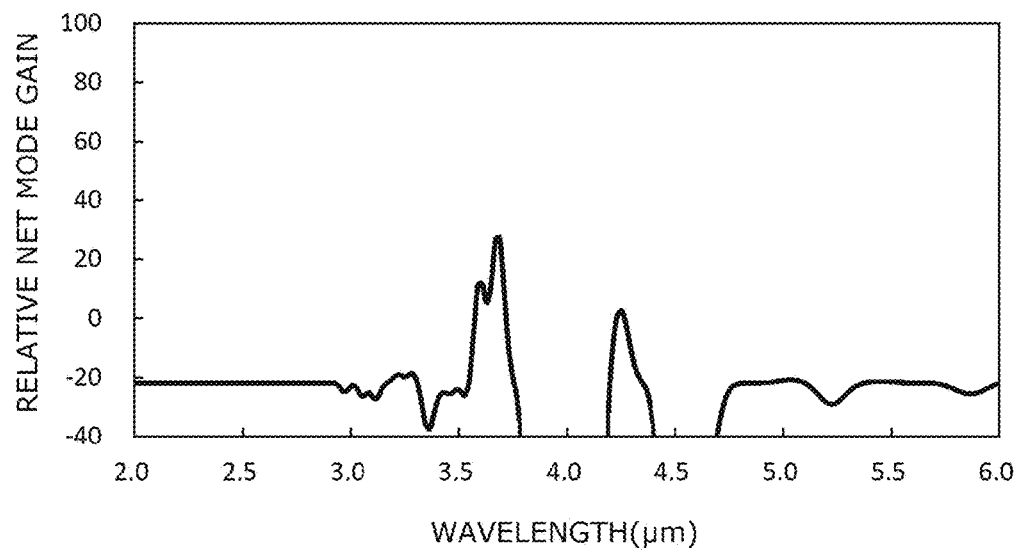
FIG. 6B is a graph representing the wavelength dependence of gain.

FIG. 6A is an energy band diagram of the conduction band of a QCL according to Third Embodiment (under applied electric field). FIG. 6B is a graph representing the wavelength dependence of gain.

Table 3 shows the configuration of the unit stacked body of the QCL according to Third Embodiment.

TABLE 3

| | | Thickness (A) | |
|---|---|---|---|
| BI | | In0.52Al0.48As | 3.7 |
| 86 | | In0.53Ga0.47As | 0.9 |
| (96) | | In0.48Al0.52As | 1.3 |
| | | In0.53Ga0.47As | 4.5 |
| | | In0.46Al0.54As | 1.3 |
| | | In0.53Ga0.47As | 3.7 |
| | | In0.52Al0.48As | 1.4 |
| | | In0.53Ga0.47As | 3.6 |
| BE | | In0.52Al0.48As | 2.2 |
| 88 | | In0.53Ga0.47As | 2.8 |
| (98) | | In0.52Al0.48As | 1.7 |
| | | In0.53Ga0.47As | 2.5 |
| | | In0.52Al0.48As | 1.8 |
| | | In0.53Ga0.47As | 2.2 |
| | | In0.52Al0.48As | 1.9 |
| | | In0.53Ga0.47As | 2.1 |
| | | In0.52Al0.48As | 2.0 |
| | | In0.53Ga0.47As | 2.0 |
| | | In0.52Al0.48As | 2.0 |
| | | In0.53Ga0.47As | 1.8 |

The well layers constituting the light-emitting quantum well layers 86 and 96 are all composed of $In_{0.53}Ga_{0.47}As$, and are lattice matched to the InP of the substrate 10. On the other hand, the adjacent two barrier layers composed of $In_{0.48}Al_{0.52}As$ and $In_{0.46}Al_{0.54}As$, respectively, in the constituent barrier layers of the light-emitting quantum well layers 86 and 96 have a lattice constant a2 smaller than the lattice constant a0 of the InP of the substrate 10. This raises the conduction band edges of the light-emitting quantum well layers 86 and 96 even more than in Second Embodiment, and makes the barrier layers taller (that is, the well layers become deeper), as indicated by broken line region RB2. The carriers are thus more effectively trapped in the well layers in the emission regions 82 and 92, and the light output can improve. The injection barrier layer BI, the extraction barrier layer BE, and the relaxation quantum well layers 88 and 98 are lattice matched to the InP of the substrate 10. This inhibits lowering crystallinity, as a whole.

As shown in FIG. 6B, the maximum gain occurs in the vicinity of 3.7 μm wavelength. This enables $^{13}CO_2$ and $^{12}CO_2$ spectral measurements.

Figure 7A:
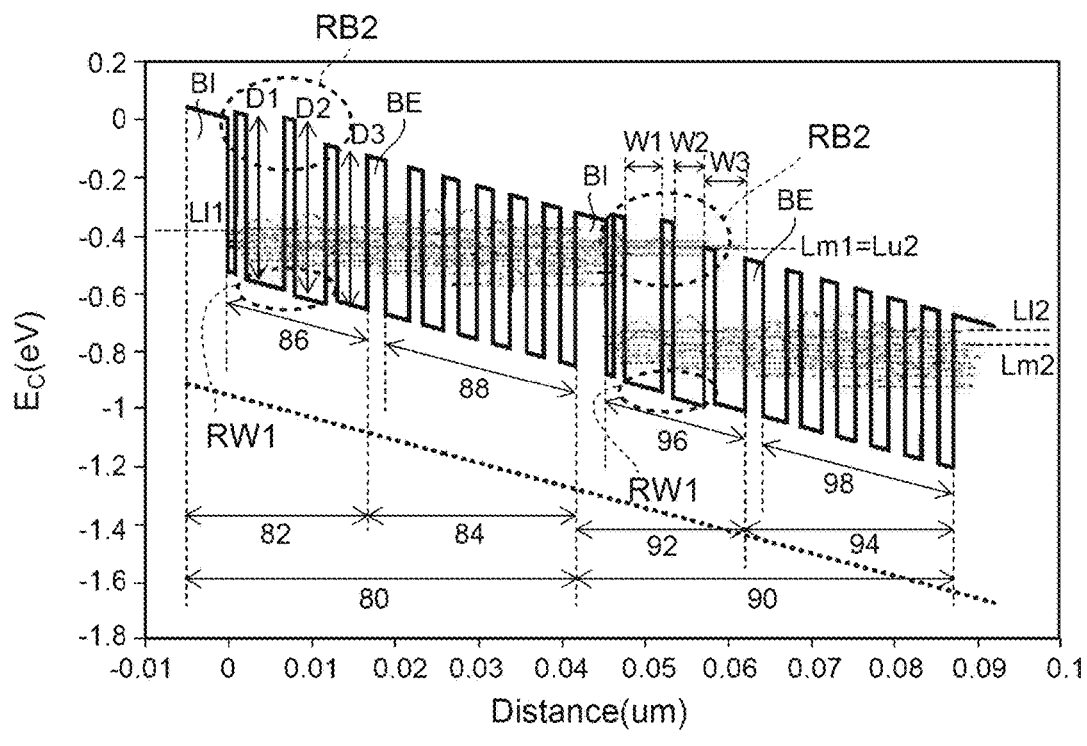
FIG. 7A is an energy band diagram of the conduction band of a QCL according to Fourth Embodiment (under applied electric field).
Figure 7B:
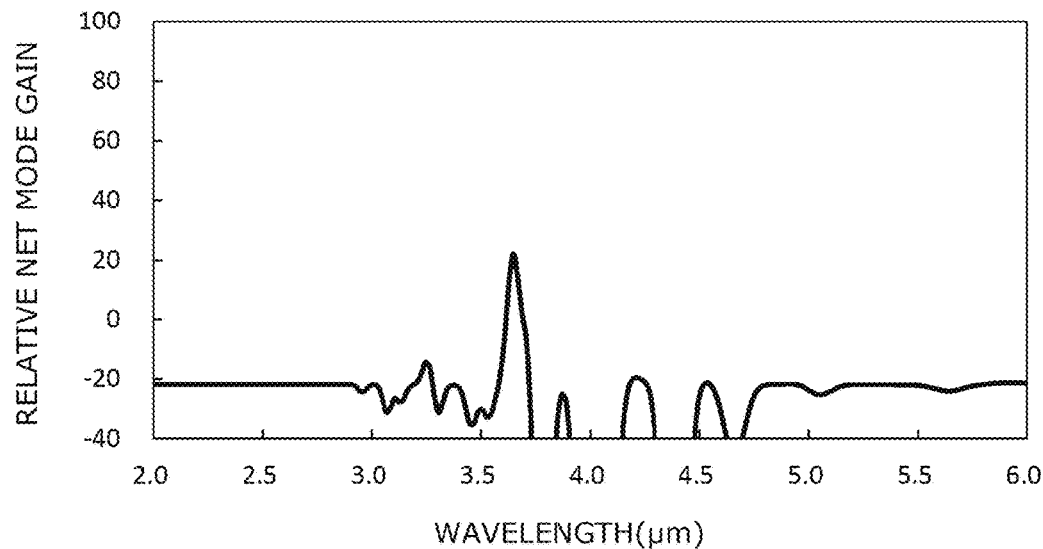
FIG. 7B is a graph representing the wavelength dependence of gain.

FIG. 7A is an energy band diagram of the conduction band of a QCL according to Fourth Embodiment (under applied electric field). FIG. 7B is a graph representing the wavelength dependence of gain.

Table 4 shows the configuration of the unit stacked body of the QCL according to Fourth Embodiment.

TABLE 4

| | Thickness (A) | |
|---|---|---|
| BI | In0.52Al0.48As | 3.7 |
| 86 | In0.53Ga0.47As | 0.9 |
| (96) | In0.50Al0.50As | 1.3 |
| | In0.55Ga0.45As | 4.5 |
| | In0.48Al0.52As | 1.3 |
| | In0.57Ga0.43As | 3.7 |
| | In0.52Al0.48As | 1.4 |
| | In0.53Ga0.47As | 3.6 |
| BE | In0.52Al0.48As | 2.2 |
| 88 | In0.53Ga0.47As | 2.8 |
| (98) | In0.52Al0.48As | 1.7 |
| | In0.53Ga0.47As | 2.5 |
| | In0.52Al0.48As | 1.8 |
| | In0.53Ga0.47As | 2.2 |
| | In0.52Al0.48As | 1.9 |
| | In0.53Ga0.47As | 2.1 |
| | In0.52Al0.48As | 2.0 |
| | In0.53Ga0.47As | 2.0 |
| | In0.52Al0.48As | 2.0 |
| | In0.53Ga0.47As | 1.8 |

The two well layers of the compositions $In_{0.55}Ga_{0.45}As$ and $In_{0.57}Ga_{0.43}As$, respectively, in the constituent well layers of the light-emitting quantum well layers 86 and 96 have a lattice constant a1 larger than the lattice constant a0 of the InP of the substrate 10. This lowers the conduction band edges of the well layers in the light-emitting quantum well layers 86 and 96, and the well layers become deeper, as indicated by broken line region RW1.

On the other hand, the two barrier layers composed of $In_{0.50}Al_{0.50}As$ and $In_{0.48}Al_{0.52}As$, respectively, in the constituent barrier layers of the light-emitting quantum well layers 86 and 96 have a lattice constant a2 smaller than the lattice constant a0 of the InP of the substrate 10. This raises the conduction band edges of the light-emitting quantum well layers 86 and 96 even more than in Second Embodiment, and makes the barrier layers taller (that is, the well layers become deeper), as indicated by broken line region RB2. The carriers are thus more effectively trapped in the well layers in the emission regions 82 and 92, and the light output can improve. The injection barrier layer BI, the extraction barrier layer BE, and the relaxation quantum well layers 88 and 98 are lattice matched to the InP of the substrate 10. This inhibits lowering crystallinity, as a whole.

As shown in FIG. 7B, the maximum gain occurs in the vicinity of 3.6 μm wavelength. This enables $^{13}CO_2$ and $^{12}CO_2$ spectral measurements.

Figure 8A:
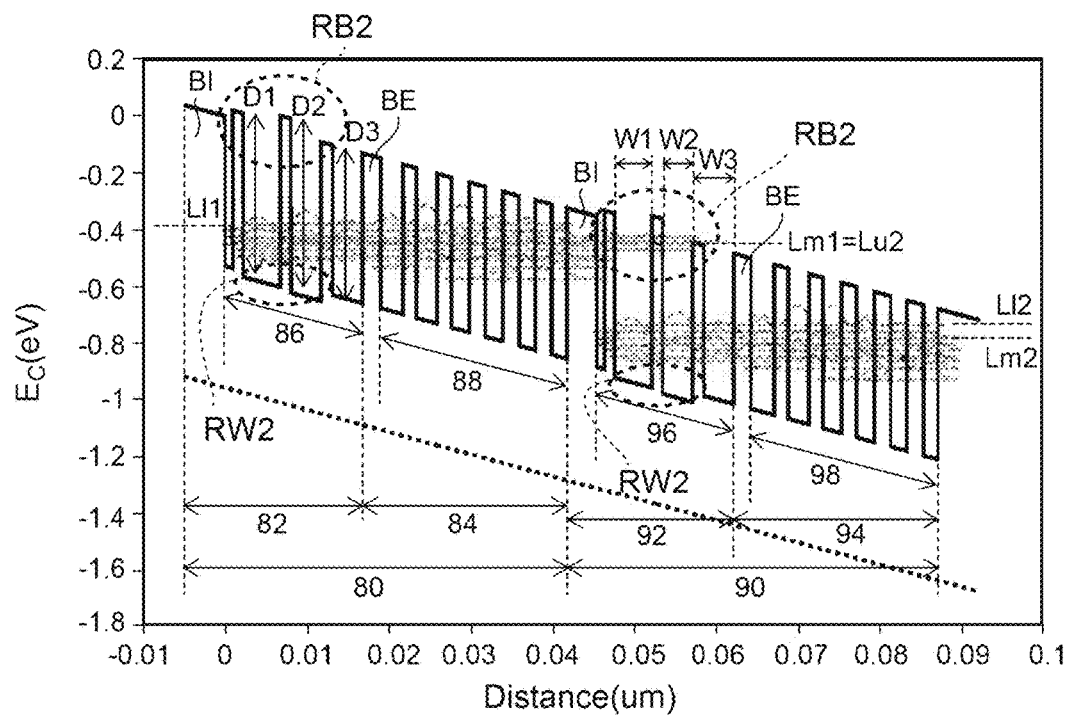
FIG. 8A is an energy band diagram of the conduction band of a QCL according to Fifth Embodiment (under applied electric field).
Figure 8B:
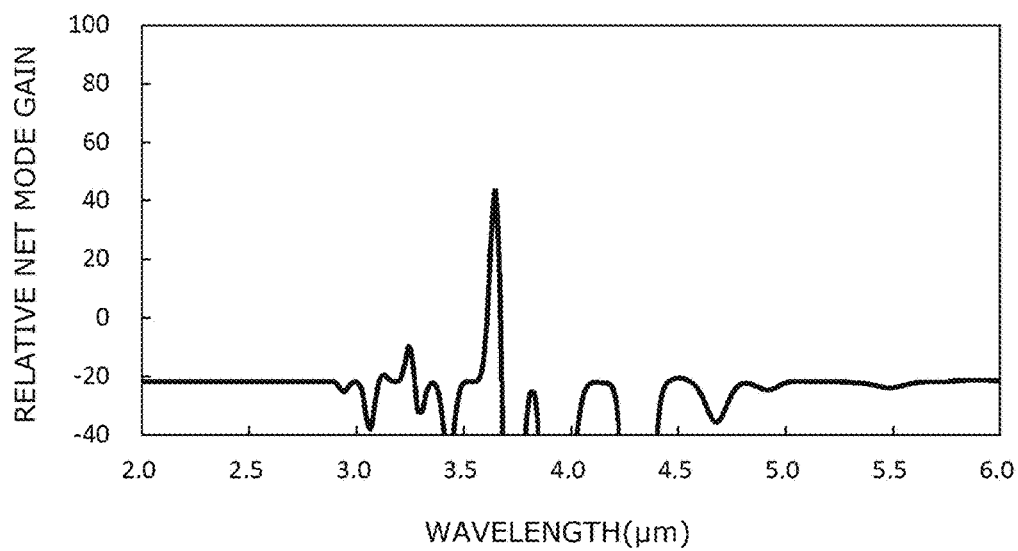
FIG. 8B is a graph representing the wavelength dependence of gain.

FIG. 8A is an energy band diagram of the conduction band of a QCL according to Fifth Embodiment (under applied electric field). FIG. 8B is a graph representing the wavelength dependence of gain.

Table 5 shows the configuration of the unit stacked body of the QCL according to Fifth Embodiment.

TABLE 5

| | Thickness (A) | |
|---|---|---|
| BI | In0.52Al0.48As | 3.7 |
| 86 | In0.53Ga0.47As | 0.9 |
| (96) | In0.50Al0.50As | 1.3 |
| | In0.57Ga0.43As | 4.5 |
| | In0.48Al0.52As | 1.3 |
| | In0.59Ga0.41As | 3.7 |
| | In0.52Al0.48As | 1.4 |
| | In0.53Ga0.47As | 3.6 |
| BE | In0.52Al0.48As | 2.2 |
| 88 | In0.53Ga0.47As | 2.8 |
| (98) | In0.52Al0.48As | 1.7 |
| | In0.53Ga0.47As | 2.5 |
| | In0.52Al0.48As | 1.8 |
| | In0.53Ga0.47As | 2.2 |
| | In0.52Al0.48As | 1.9 |
| | In0.53Ga0.47As | 2.1 |
| | In0.52Al0.48As | 2.0 |
| | In0.53Ga0.47As | 2.0 |
| | In0.52Al0.48As | 2.0 |
| | In0.53Ga0.47As | 1.8 |

The two well layers of the compositions $In_{0.57}Ga_{0.43}As$ and $In_{0.59}Ga_{0.41}As$, respectively, in the constituent well layers of the light-emitting quantum well layers 86 and 96 have a lattice constant a1 larger than the lattice constant a0 of the InP of the substrate 10. This lowers the conduction band edges of the well layers in the light-emitting quantum well layers 86 and 96, and the well layers become deeper, as indicated by broken line region RW2.

On the other hand, the two barrier layers composed of $In_{0.50}Al_{0.50}As$ and $In_{0.48}Al_{0.52}As$, respectively, in the constituent barrier layers of the light-emitting quantum well layer 86 have a lattice constant a2 smaller than the lattice constant a0 of the InP of the substrate 10. This raises the conduction band edges of the light-emitting quantum well layers 86 and 96 even more than in Second Embodiment, and makes the barrier layers taller (that is, the well layers become deeper), as indicated by broken line region RB2. The carriers are thus more effectively trapped in the well layers in the emission regions 82 and 92, and the light output can improve. The injection barrier layer BI, the extraction barrier layer BE, and the relaxation quantum well layers 88 and 98 are lattice matched to the InP of the substrate 10. This inhibits lowering crystallinity, as a whole.

As shown in FIG. 8B, the maximum gain occurs in the vicinity of 3.6 μm and 4.3 μm wavelengths. This enables $^{13}CO_2$ and $^{12}CO_2$ spectral measurements.

Figure 9A:
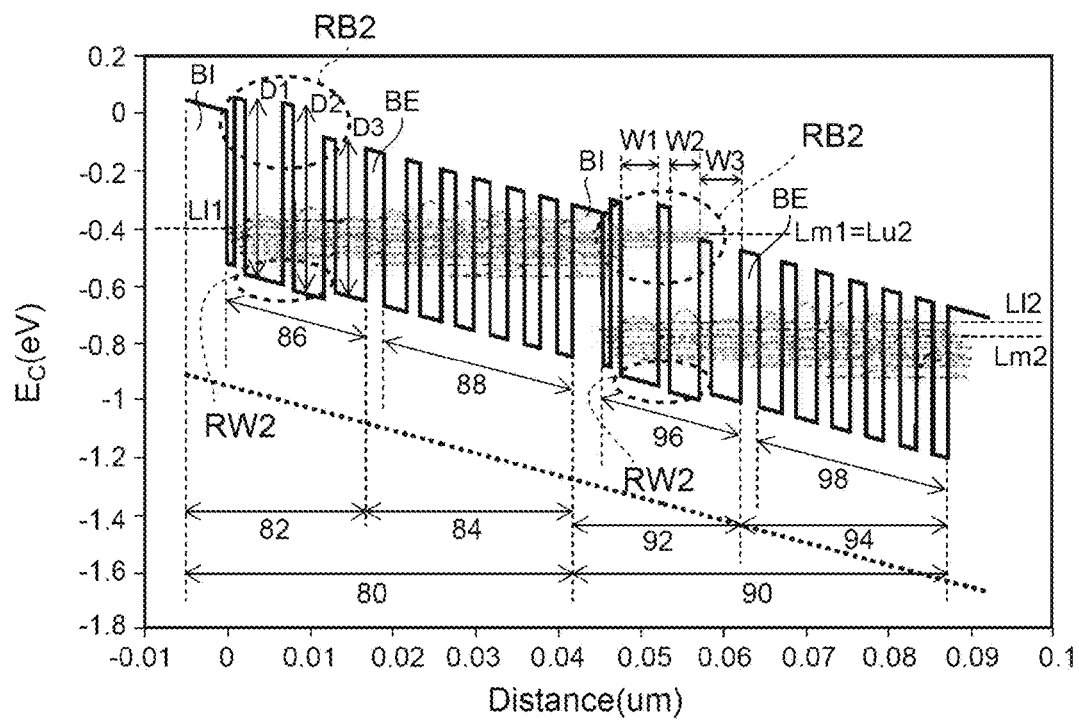
FIG. 9A is an energy band diagram of the conduction band of a QCL according to Sixth Embodiment (under applied electric field).
Figure 9B:
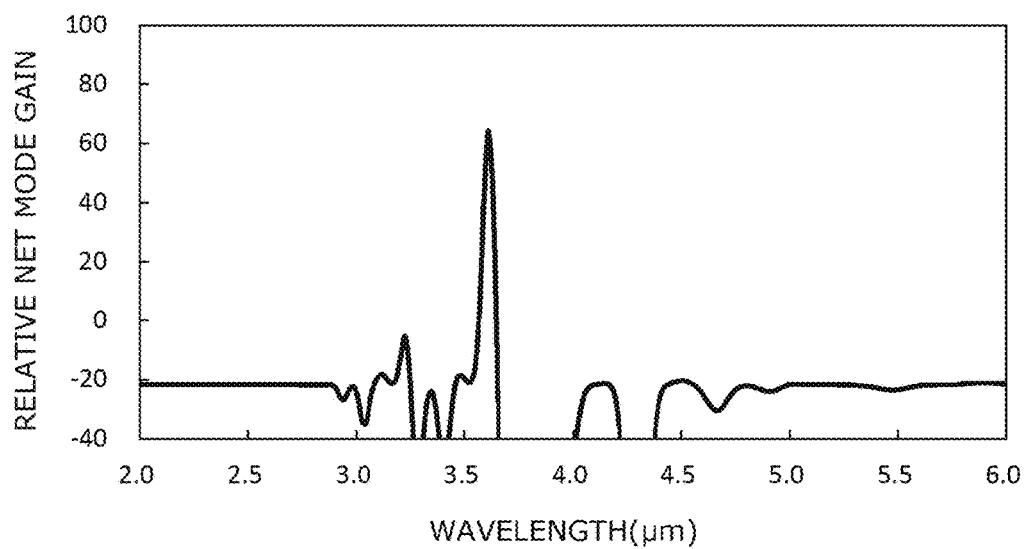
FIG. 9B is a graph representing the wavelength dependence of gain.

FIG. 9A is an energy band diagram of the conduction band of a QCL according to Sixth Embodiment (under applied electric field). FIG. 9B is a graph representing the wavelength dependence of gain.

Table 6 shows the configuration of the unit stacked body of the QCL according to Seventh Embodiment.

TABLE 6

| | Thickness (A) | |
|---|---|---|
| BI | In0.52Al0.48As | 3.7 |
| 86 | In0.53Ga0.47As | 0.9 |
| (96) | In0.48Al0.52As | 1.3 |
| | In0.57Ga0.43As | 4.5 |
| | In0.46Al0.54As | 1.3 |

TABLE 6-continued

| | Thickness (A) | |
|---|---|---|
| | In0.59Ga0.41As | 3.7 |
| | In0.52Al0.48As | 1.4 |
| | In0.53Ga0.47As | 3.6 |
| BE | In0.52Al0.48As | 2.2 |
| 88 | In0.53Ga0.47As | 2.8 |
| (98) | In0.52Al0.48As | 1.7 |
| | In0.53Ga0.47As | 2.5 |
| | In0.52Al0.48As | 1.8 |
| | In0.53Ga0.47As | 2.2 |
| | In0.52Al0.48As | 1.9 |
| | In0.53Ga0.47As | 2.1 |
| | In0.52Al0.48As | 2.0 |
| | In0.53Ga0.47As | 2.0 |
| | In0.52Al0.48As | 2.0 |
| | In0.53Ga0.47As | 1.8 |

The two well layers of the compositions $In_{0.57}Ga_{0.43}As$ and $In_{0.59}Ga_{0.41}As$, respectively, in the constituent well layers of the light-emitting quantum well layers 86 and 96 have a lattice constant a1 larger than the lattice constant a0 of the InP of the substrate 10. This lowers the conduction band edges of the well layers in the light-emitting quantum well layers 86 and 96, and the well layers become deeper.

On the other hand, the two barrier layers composed of $In_{0.48}Al_{0.52}As$ and $In_{0.46}Al_{0.54}As$, respectively, in the constituent barrier layers of the light-emitting quantum well layers 86 and 96 have a lattice constant a2 smaller than the lattice constant a0 of the InP of the substrate 10. This raises the conduction band edges of the light-emitting quantum well layers 86 and 96 even more than in Second Embodiment, and makes the barrier layers taller (that is, the well layers become deeper). The carriers are thus more effectively trapped in the well layers in the emission regions 82 and 92, and the light output can improve. The injection barrier layer BI, the extraction barrier layer BE, and the relaxation quantum well layers 88 and 98 are lattice matched to the InP of the substrate 10. This inhibits lowering crystallinity, as a whole.

As shown in FIG. 9B, the maximum gain occurs in the vicinity of 3.55 μm wavelength. This enables $^{13}CO_2$ and $^{12}CO_2$ spectral measurements.

Figure 10A:
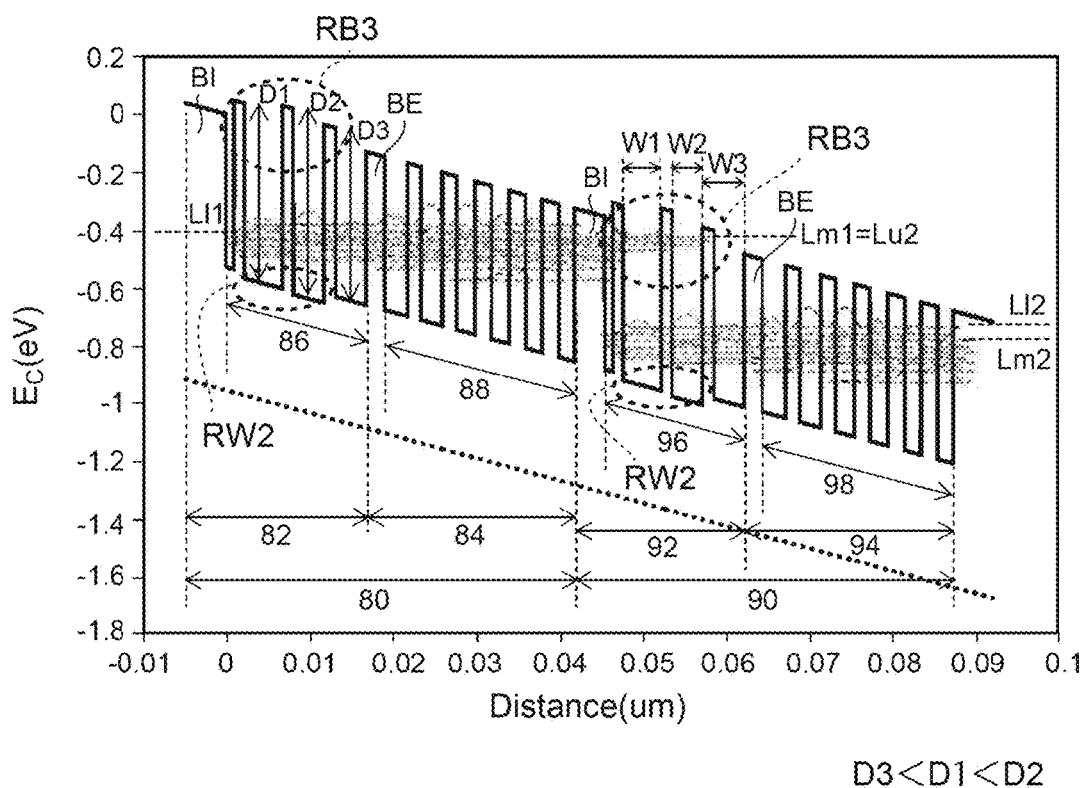
FIG. 10A is an energy band diagram of the conduction band of a QCL according to Seventh Embodiment (under applied electric field).
Figure 10B:
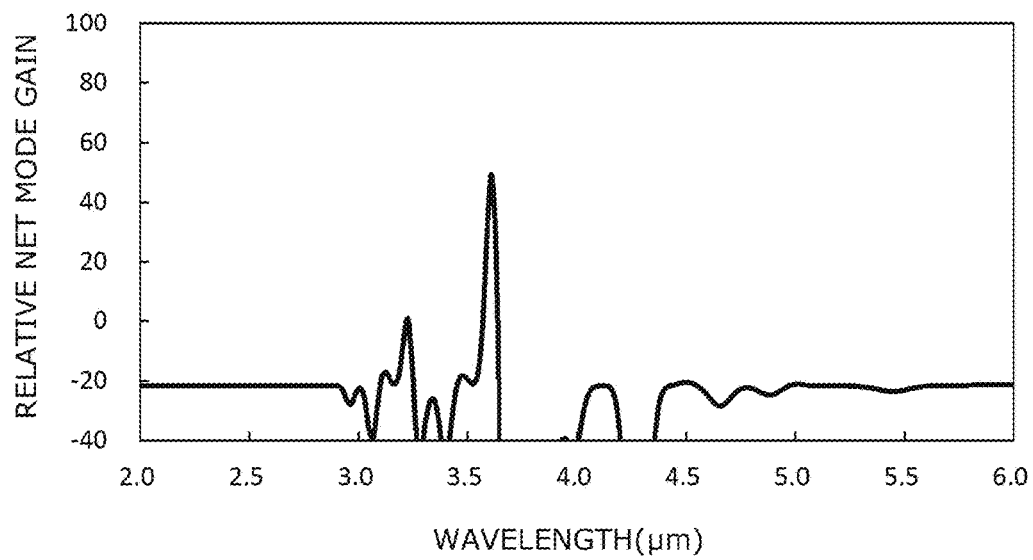
FIG. 10B is a graph representing the wavelength dependence of gain.

FIG. 10A is an energy band diagram of the conduction band of a QCL according to Seventh Embodiment (under applied electric field). FIG. 10B is a graph representing the wavelength dependence of gain.

Table 7 shows the configuration of the unit stacked body of the QCL according to Seventh Embodiment.

TABLE 7

| | Thickness (A) | |
|---|---|---|
| BI | In0.52Al0.48As | 3.7 |
| 86 | In0.53Ga0.47As | 0.9 |
| (96) | In0.48Al0.52As | 1.3 |
| | In0.57Ga0.43As | 4.5 |
| | In0.46Al0.54As | 1.3 |
| | In0.59Ga0.41As | 3.7 |
| | In0.48Al0.52As | 1.4 |
| | In0.53Ga0.47As | 3.6 |
| BE | In0.52Al0.48As | 2.2 |
| 88 | In0.53Ga0.47As | 2.8 |
| (98) | In0.52Al0.48As | 1.7 |
| | In0.53Ga0.47As | 2.5 |
| | In0.52Al0.48As | 1.8 |
| | In0.53Ga0.47As | 2.2 |
| | In0.52Al0.48As | 1.9 |
| | In0.53Ga0.47As | 2.1 |
| | In0.52Al0.48As | 2.0 |

TABLE 7-continued

| | Thickness (A) |
|---|---|---|
| | In0.53Ga0.47As | 2.0 |
| | In0.52Al0.48As | 2.0 |
| | In0.53Ga0.47As | 1.8 |

The two well layers of the compositions $In_{0.57}Ga_{0.43}As$ and $In_{0.59}Ga_{0.41}As$, respectively, in the constituent well layers of the light-emitting quantum well layers 86 and 96 have a lattice constant a1 larger than the lattice constant a0 of the InP of the substrate 10. This lowers the conduction band edges of the well layers in the light-emitting quantum well layers 86 and 96, and the well layers become deeper, as indicated by broken line region RW2.

On the other hand, the three barrier layers composed of $In_{0.43}Al_{0.52}As$, $In_{0.46}Al_{0.54}As$, and $In_{0.48}Al_{0.52}As$, respectively, in the constituent barrier layers of the light-emitting quantum well layers 86 and 96 have a lattice constant a2 smaller than the lattice constant a0 of the InP of the substrate 10. This raises the conduction band edges of the light-emitting quantum well layers 86 and 96 even more than in Second Embodiment, and makes the barrier layers taller (that is, the well layers become deeper), as indicated by broken line region RB3. The carriers are thus more effectively trapped in the well layers in the emission regions 82 and 92, and the light output can improve. The injection barrier layer BI, the extraction barrier layer BE, and the relaxation quantum well layers 88 and 98 are lattice matched to the InP of the substrate 10. This inhibits lowering crystallinity, as a whole.

As shown in FIG. 10B, the maximum gain occurs in the vicinity of 3.55 μm wavelength. This enables $^{13}CO_2$ and $^{12}CO_2$ spectral measurements.

First to Seventh Embodiments provide quantum cascade lasers that can produce high output in a wavelength band of 4.4 μm or less.

Figure 11A:
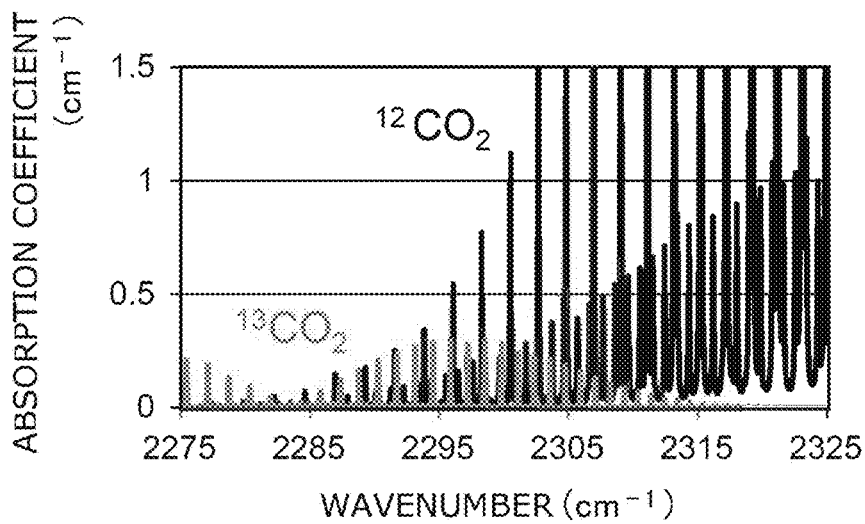
FIG. 11A is a graph representing the absorption coefficients of 13CO2 and 12CO2 at wavenumbers of 2,275 to 2,325 cm−1.
Figure 11B:
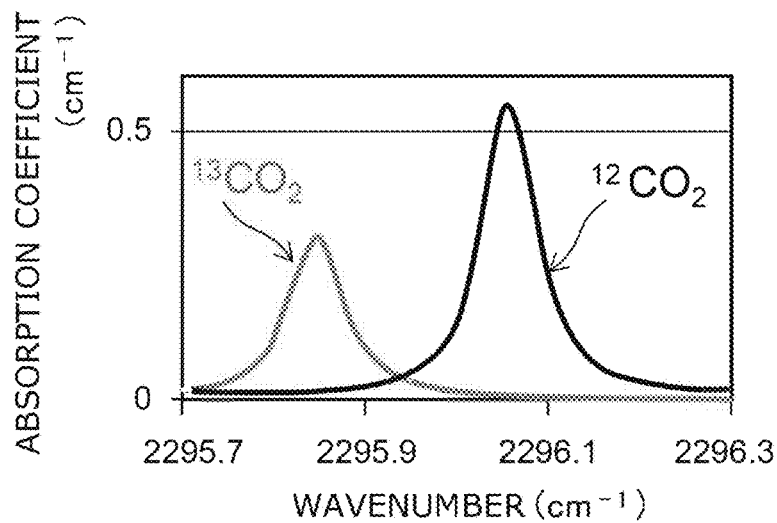
FIG. 11B is a graph representing absorption coefficients at wavenumbers of 2,295.7 to 2,296.3 cm−1.

FIG. 11A is a graph representing the absorption coefficients of $^{13}CO_2$ and $^{12}CO_2$ at wavenumbers of 2,275 to 2,325 $cm^{-1}$. FIG. 11B is a graph representing absorption coefficients at wavenumbers of 2,295.7 to 2,296.3 $cm^{-1}$.

The $CO_2$ concentration is 8%, the pressure is 0.5 atm, and the temperature is 313 K.

As an example, detection of *Helicobacter pylori* is possible with the use of isotopes of $^{13}CO_2$ and $^{12}CO_2$. First, a $^{13}C$-urea-containing reagent is given to a human as a labeled compound. If *Helicobacter pylori* is present in the stomach, the bacteria react with the reagent, and $^{13}CO_2$ is discharged as a response to nausea. On the other hand, there is no $^{13}CO_2$ discharge when *Helicobacter pylori* is absent. The extent of *Helicobacter pylori* infection can thus be found by measuring the isotope ratio of $^{13}CO_2$ and $^{12}CO_2$, and this enables accurate diagnosis of stomach. The test target is not limited to *Helicobacter pylori*. Diagnosis of stomach dischargeability can be made in a wide range of applications through measurements of $CO_2$ concentrations including isotopes.

In such applications, saturation at high gas concentrations can be inhibited, and the measurement accuracy can improve when infrared light is used that has a wavenumber range in which the absorption coefficients of $^{13}CO_2$ and $^{12}CO_2$ are approximately the same. For example, the preferred wavenumber range is between 2,275 $cm^{-1}$ (wavelength of 4.396 μm) and 2,325 $cm^{-1}$ (wavelength of 4.301 μm), as shown in FIG. 11A. FIG. 11B shows a wavenumber range with one absorption line for $^{12}CO_2$, and one absorption line for $^{13}CO_2$.

In the QCL of Comparative Example, the maximum gain occurs at a wavelength of 4.4 μm or more, and it is difficult to cover the preferred wavenumber range. On the other hand, the maximum gain can be controlled within a 3.55 to 4.5 μm range in the embodiment. A breath analyzer using the QCL of the embodiment as a light source thus enables accurate measurements of the isotope ratio of the $^{13}CO_2$ and $^{12}CO_2$ contained in the breath, and is useful for the diagnosis of humans, including the stomach.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:

1. A quantum cascade laser comprising:
   a substrate, and
   an active layer including a plurality of emission regions and a plurality of injection regions, each emission region including an injection barrier layer, and a light-emitting quantum well layer that has three continuous well layers emitting infrared light by undergoing an intersubband transition,
   each injection region including an extraction barrier layer, and a relaxation quantum well layer that creates an energy level for relaxing the energy of carriers from the each emission region, the active layer being provided on the substrate,
   a lattice constant of at least one barrier layer of the each emission region being smaller than a lattice constant of the substrate,
   a well layer on a side of the injection barrier layer being deeper than a well layer on a side of the extraction barrier layer and shallower than an intermediate well layer in the three continuous well layers,
   a wavelength of the infrared light being less than 4.3 μm, the each emission region and the each injection region being alternately stacked.

2. The laser according to claim 1, wherein at least two conduction band edges of the barrier layers of the light-emitting quantum well layer have a same energy in the intersubband transition occurring in response to an applied electric field.

3. The laser according to claim 1, wherein the light-emitting quantum well layer of the each emission region has at least one well layer having a lattice constant larger than the lattice constant of the substrate.

4. The laser according to claim 2, wherein the light-emitting quantum well layer of the each emission region has at least one well layer having a lattice constant larger than the lattice constant of the substrate.

5. The laser according to claim 1, wherein the relaxation quantum well layer of the each injection region has a barrier layer and a well layer matched to the lattice constant of the substrate.

6. The laser according to claim 5, wherein the relaxation quantum well layer of the each injection region has a plurality of well layers of a same depth.

7. The laser according to claim 1, wherein:
   the substrate contains InP,
   the each emission region has a first multiple quantum well layer that includes a well layer containing InGaAs, and a barrier layer containing InAlAs, and
   the each injection region has a second multiple quantum well layer that includes a well layer containing InGaAs, and a barrier layer containing InAlAs.

8. The laser according to claim 1, wherein the light-emitting quantum well layer of the each emitting region has well layers matched to the lattice constant of the substrate.

9. The laser according to claim 1, wherein a lattice constant of the intermediate well layer is larger than the lattice constant of the substrate.

10. The laser according to claim 1, wherein the injection barrier layer and the extraction barrier layer are matched to the lattice constant of the substrate.

* * * * *